United States Patent [19]

Takahashi et al.

[11] 4,117,406

[45] Sep. 26, 1978

[54] MUTING ARRANGEMENT FOR AM SYNCHRONOUS DETECTOR USING A PLL CIRCUIT

[75] Inventors: Susumu Takahashi, Tokyo; Hiroshi Iida, Machida, both of Japan

[73] Assignee: Sansui Electric Co., Ltd., Tokyo, Japan

[21] Appl. No.: 782,355

[22] Filed: Mar. 29, 1977

[30] Foreign Application Priority Data

Mar. 31, 1976 [JP] Japan .................................. 51-35529

[51] Int. Cl.[2] ............................................. H04B 1/16
[52] U.S. Cl. .................................... 325/348; 325/478; 307/360; 329/124
[58] Field of Search ................ 325/348, 349, 419–421, 325/456, 478, 479, 480; 329/50, 122, 124; 328/111, 112, 115; 307/232, 234, 360, 364

[56] References Cited

U.S. PATENT DOCUMENTS

| | | | |
|---|---|---|---|
| 3,100,871 | 8/1963 | Richardson et al. | 325/478 |
| 3,358,234 | 12/1967 | Stover | 325/478 |
| 3,397,360 | 8/1968 | Kaneko et al. | 325/348 |
| 3,555,305 | 1/1971 | Luczkowski | 328/112 |
| 3,626,294 | 12/1971 | Dancy | 325/478 |
| 3,679,780 | 10/1972 | Michael et al. | 307/360 |
| 3,769,592 | 10/1973 | Espe | 325/478 |
| 3,939,425 | 2/1976 | Toyoshima | 325/478 |

*Primary Examiner*—John C. Martin
*Assistant Examiner*—Jin F. Ng
*Attorney, Agent, or Firm*—Harris, Kern, Wallen & Tinsley

[57] ABSTRACT

The output voltage of an AM synchronous detector is compared with a reference potential level by a voltage comparator. A muting device connected with the output of the detector is controlled by a control circuit connected with the comparator. Through this control circuit, the detector output is immediately muted when the detector output level falls below the reference potential level, and the muting of the detector output is removed after a predetermined retardation when the detector output level exceeds the reference potential level.

7 Claims, 5 Drawing Figures

MUTING ARRANGEMENT FOR AM SYNCHRONOUS DETECTOR USING A PLL CIRCUIT

The present invention relates to a muting arrangement used with an AM synchronous detector using a PLL (phase locked loop) circuit.

It is well known that interference, noise, and distortion are little in the AM synchronous detection, as compared to the envelope detection. Known in that, for the AM synchronous detection, a synchronous carrier wave with the radio frequency or the intemediate frequency must be formed in an AM receiver and employment of PLL is preferable for formation of the synchronous carrier wave. When a desired broadcast wave is selected, if the PLL does not lock in the carrier frequency (radio frequency or intermediate frequency) of an AM input signal, the detector produces a beat component dependent on the difference between the output frequency of the PLL and the carrier frequency of the AM signal. More specifically, in a heterodyne receiver, for example, when the receiver is exactly tuned to the broadcast wave from an broadcasting station, the intermediate frequency fed to the PLL is 455 KHz which is equal to the free-running frequency of the PLL, while, when it is not exactly tuned to the broadcast wave, the intermediate frequency shifts from 455 KHz to the upper or lower. In detuning, if the intermediate frequency is one the PLL cannot capture or lock, the difference between the intermediate frequency and the output frequency of the PLL produces the beat component. When the difference between the output and input frequencies of the PLL falls within an audible frequency range, the amplitude of the beat component is relatively large and the beat component produced is uncomfortable for listeners.

Accordingly, the primary object of the present invention is to provide a muting arrangement for an AM synchronous detector using a PLL circuit in which a beat component produced at the output of a synchronous detector when the PLL does not lock in the AM input signal is effectively muted.

According to this invention there is provided a muting arrangement for an AM synchronous detector using a PLL circuit, comprising: muting means coupled with the output of a synchronous detector for muting the output from the detector; first voltage comparing means for comparing the detector output level with a first reference potential level; and control means coupled between the output of said first comparing means and said muting means for causing said muting means to immediately mute the detector output, when the detector output level falls below the first reference potential level and to stop the muting operation against the detector output in a predetermined retardation when the detector output level exceeds the first reference potential level.

Other objects and features of the present invention will be apparent upon careful consideration of the following description when taken in connection with the accompanying drawings, in which.

Figure 1:
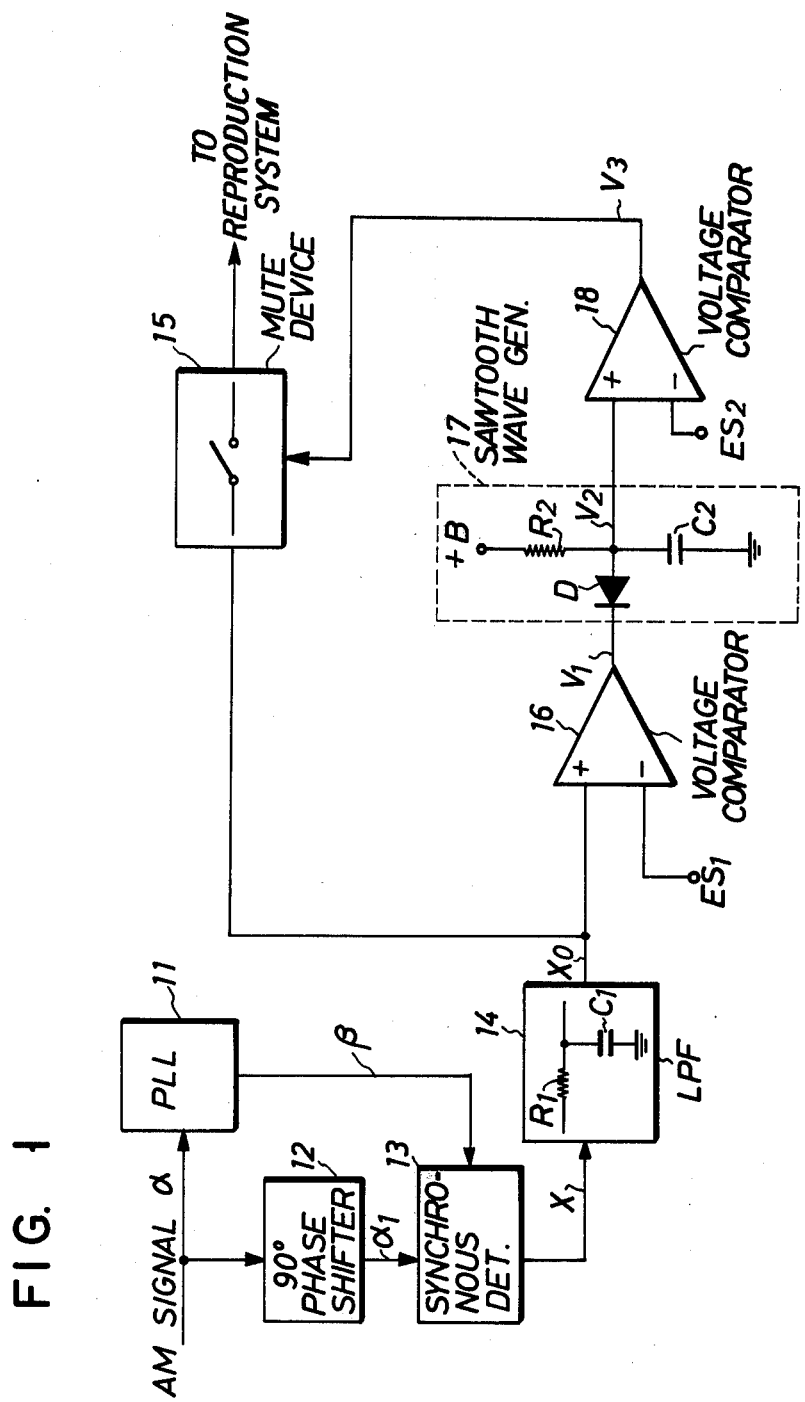
FIG. 1 is a block diagram of a muting arrangement according to one embodiment of the present invention.

Reference will be made to FIG. 1 illustrating the first embodiment of the present invention. As shown, an AM input signal $\alpha$ with a radio frequency or intermediate frequency is fed to a PLL circuit 11 and also to a phase shifter 12. The PLL circuit 11 produces a synchronous carrier $\beta$ for demodutation having the same frequency as of the carrier component of the AM input signal $\alpha$. The phase shifter 12 phase-shifts the AM input signal $\alpha$ by the phase angle equal to the phase difference $\phi$ between the input and output signals of the PLL circuit 11, thereby to produce a signal $\alpha_1$ whose carrier is in phase with the synchronous carrier $\beta$. A synchronous detector 13 multiplies the AM signal $\alpha_1$ by the synchronous carrier $\beta$ to produce a detected output signal $\chi$. The detected output $\chi$ is applied to a lowpass filter 14 including a resistor $R_1$ and a capacitor $C_1$ where unnecessary high frequency components thereof are eliminated to produce another detected output signal $\chi_0$.

The AM input signal $\alpha$ is generally expressed as follows:

$$\alpha = (1 + A\sin pt)\sin\omega_c t \quad (1)$$

where A is an amplitude of the modulating signal, P is an angular frequency of the modulating signal, and $\omega_c$ is angular frequency of the carrier wave.

The output signal $\alpha_1$ of the phase shifter 12 is given as follows:

$$\alpha_1 = (1 + A\sin pt)\sin(\omega_c t - \phi) \quad (2)$$

where $\phi$ is the phase shift angle given by the phase shifter 12.

The output signal $\beta$ of the PLL circuit 11 is given below $$\beta = B\sin(\omega_0 t = \phi_o) \quad (3)$$

where B is the amplitude of the carrier wave $\beta$ for demodulation, $\omega_0$ is the angular frequency of the carrier wave $\beta$, and $\phi_0$ is the phase of the carrier $\beta$.

The output signal $\chi$ of the synchronous detector 13 is given $$\chi = \alpha_1 \cdot \beta = (1 + A\sin pt)\cdot\sin(\omega_0 t - \phi)B\sin(\omega_0 t - \phi_0)$$
$$= (B/2)(1+A\sin pt)\cdot\cos\{(\omega_c - \omega_0)t - (\phi - \phi_0)\}$$
$$- (B/2)(1+A\sin pt)\cdot\cos\{(\omega_c + \omega_0)t - (\phi + \phi_0)\} \quad (4)$$

The output signal $\chi_0$ of the lowpass filter 14 is $$\chi_0 = K(1+A\sin pt)\cos\{(\omega_c-\omega_0)t - (\phi-\phi_0)\} \quad (5)$$

where K is a constant.

When the PLL 11 locks in the input signal $\alpha$, $\omega_c = \omega_0$ and $\phi_0 = \pi/2$, and thus the detector output $\chi_0$ (lock) is expressed as follows:

$$\chi_0 \text{(lock)} = K(1+A\sin pt)\cos(\pi/2-\phi) \quad (6)$$

The demodulation efficiency becomes maximum when $\phi = 90°$ ($\pi/2$), and the detected output signal $\chi_0$ (lock) at this time is $$\chi_0 (\text{lock}) = K(1 + A\sin pt) \qquad (7)$$

When $A < 1$, i.e., the modulation index is below 100%, $\chi_0$(lock) $> 0$. This indicates the average DC level of the detecting output $\chi_0$ is positive.

When the PLL 11 does not lock in the input signal $\alpha$, the detector output $\chi_0$ is given $$\chi_0 = K(1 + A\sin pt)\cos\Delta\omega t \qquad (8)$$

where $\Delta\omega = (\omega_c - \omega_0)t - (\phi - \phi_0)$.

The equation (8) indicates that, when the PLL does not lock into the AM input signal, a beat component is produced which swings positive and negative and has a frequency equal to the difference between the output frequency of the PLL and the carrier frequency of the AM signal. The amplitude of the beat component becomes larger as the difference between the angular frequencies of the carriers $\alpha$ and $\alpha_1$, $\omega_c - \omega_0$ is smaller, due to the characteristic of the lowpass filter 14. Therefore, when the angular frequency difference $\omega_c - \omega_0$ exists in the audible frequency range, the amplitude of the beat is large.

In the present invention, the output of the lowpass filter 14 is coupled with the reproduction system through a mute device 15. The output of the lowpass filter 14 also is connected with the non-inverting input of a first voltage comparator 16 where it is compared with a first reference potential Es1 given to the inverting input of the comparator 16. The first reference potential Es1 is set lower than the average DC level of the detector output signal $\chi_0$ (lock). Taking into consideration a weak electric field region, the first reference potential Es1 may be set slightly higher than the ground potential.

The first voltage comparator 16 is designed such that, when the detected output level is higher than the reference potential Es1, its output is a high voltage. The voltage comparator 16 is connected at the output with a sawtooth wave generator or an integrator 17. The sawtooth wave generator 17 comprises a series circuit of a resistor R2 and a capacitor C2 connected across a DC voltage supply, and a diode D connecting the junction between the resistor R2 and the capacitor C2 to the output of the voltage comparator 16, with the polarity as shown in the figure. When the output of the comparator 16 is at the high level, the diode D is rendered nonconductive so that the capacitor C2 is charged through the resistor R2, thereby forming a sawtooth wave. Conversely, when the output of the comparator 16 is at low level, i.e., the detector output level is lower than the reference potential Es1, the capacitor C2 discharges through the diode D and the comparator 16.

The output of the sawtooth wave generator 17 is connected to the non-inverting input of a second voltage comparator 18 where it is compared with a second reference potential Es2 given to the inverting input of the comparator 18. When the output signal v2 of the sawtooth wave generator 17 is lower than the reference Es2, the second comparator 18 becomes low at the output to turn off the switch circuit 15. The result is that no detector output signal is delivered to the reproduction system. On the other hand, when the output signal v2 of the sawtooth wave generator 17 is higher than the reference potential Es2, the output signal v3 of the second comparator 18 becomes high to turn on the switch circuit 15. The result is that the detector output signal is delivered to the reproduction system.

Description to follow reference to FIGS. 2A to D is the operation of the muting arrangement of FIG. 1. FIG. 2A shows the waveform of the detector output $\chi_0$ when a receiver is changed in tuning from one to another broadcasting station. It is assumed in this case that only carrier wave is transmitted. The detector output $\chi_0$ is higher than the first reference potential Es1 during the tuning period from $t_0$ to $t_1$. As shown, the beat is produced during the period $t_1$ to $t_6$. At $t_1$, the PLL fails to follow the input frequency. At time $t_6$, the receiver starts to tune to the broadcast wave of another station. The amplitude of the beat component is larger as the frequency is lower. As the PLL fails to follow the input signal, the detector output level descends to be below the first reference potential Es1. At this time, the output v1 of the first comparator 16 changes from the high to low level, as shown in FIG. 2B. Accordingly, the capacitor C2 charged is discharged through the path of the diode D1 and the comparator 16 so that the output v2 of the sawtooth wave generator 17 changes from the high to low level. Therefore, the output v2 of the sawtooth wave generator 17 becomes lower than the second reference level Es2, with the result that the output v3 changes from the high to low level. This causes the switch circuit 15 to turn off and consequently the detector output $\chi_0$ is muted. At time $t_3$, the detector output level exceeds the first reference potential Es1, causing the output v1 of the first level detector to be high in level. This makes the diode D nonconductive, with the result that the capacitor C2 is gradually charged at the time constant determined by the values of the capacitor C2 and the resistor R2. When, through this charging of the capacitor C2, the output v2 exceeds the second reference potential Es2 (at time $t_4$), the second comparator 18 becomes high at the output. At time $t_5$, the detector output level falls below the first reference level Es1, and at this time the output v2 of the sawtooth generator 17 and the output v3 of the second level comparator 18 are rendered low. During the period $t_4$ to $t_5$, the detector output $\chi_0$ is fed to the reproduction system.

The amplitude of the output v2 of the sawtooth wave generator 17 is inversely proportional to the frequency of the output v1 of the first comparator 16. Accordingly, if the output v2 is below the second reference level Es2 after time $t_5$, the second comparator 18 sustains its low level at the output, to mute the detector output.

At time $t_6$, the PLL locks in the input frequency and the detector output level exceeds the first reference potential Es1 while at the same time the output v1 of the first level comparator 16 is made high in level. As a result, the capacitor C2 is charged and the output v2 exceeds the second reference potential Es2 at $t_7$. For this reason, the output v3 of the second comparator 18 becomes high in level at time $t_7$ to turn on the switch circuit 15. The time interval $t_6$ to $t_7$, that is, from the time when the PLL is locked in the input frequency to the time when the muting of the detector output is completed, is determined by the time constant of the sawtooth wave generator 17 and the second reference potential Es2.

Figure 2:
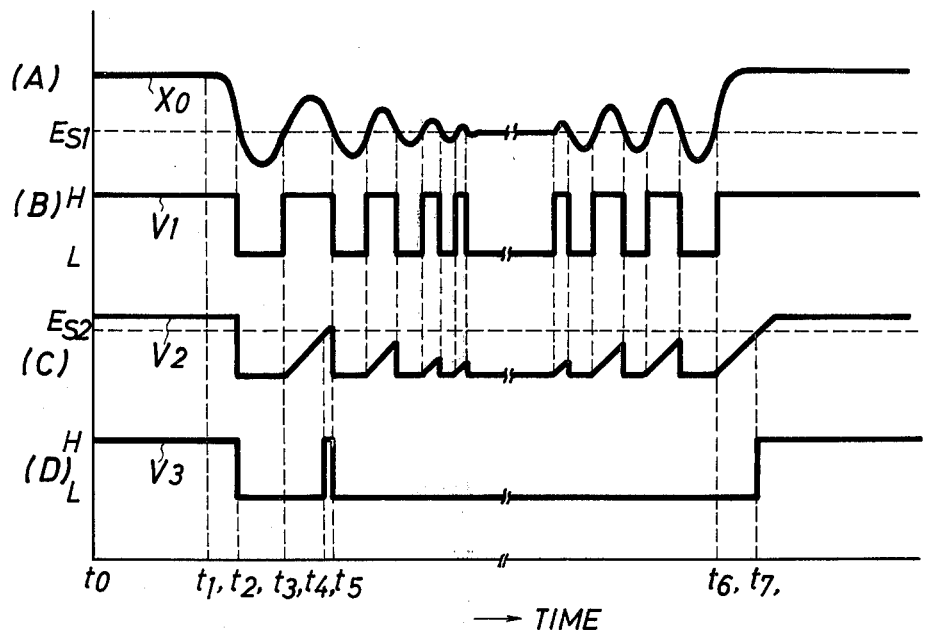
FIG. 2 is a set of waveform diagrams useful in explaining the operation of the muting arrangement shown in FIG. 1.
Figure 3:
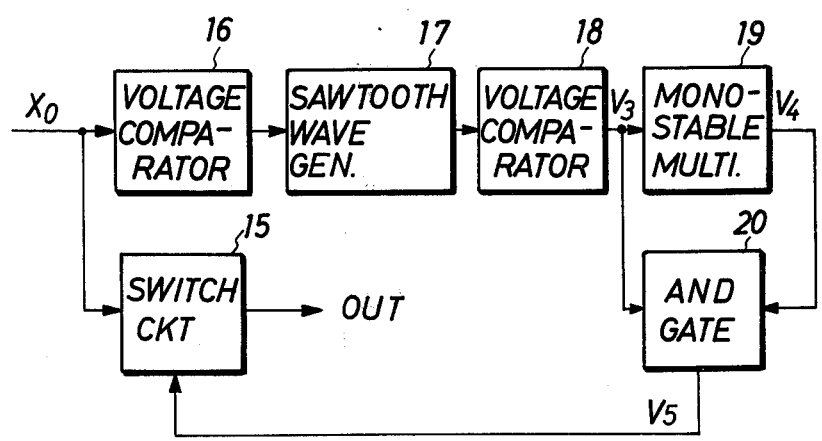
FIG. 3 is a block diagram of another embodiment of the muting arrangement according to the present invention.

As shown FIG. 2, it is not desirable that the muting of the detector output is removed during the period of time $t_1$ to $t_6$, as the period $t_4$ to $t_5$. This will be solved by increasing the time constant defined by C2 and R2. In this case, however, increased is the period of time from the time when the PLL is locked in the input frequency to the time when the muting operation is removed. The muting-off period $t_4$ to $t_5$ takes place after the input frequency escapes from the lock range of the PLL rather than before the input frequency enters the capture range of the PLL. The reason for this is that the beat frequency after the input frequency departs from the lock range of the PLL is lower than that before the input frequency enters the capture range of the PLL. The undesirable mute-off phenomenon during the mute-on period as mentioned above is solved by an embodiment as shown in FIG. 3. In the figure, a monostable multivibrator designated by reference numeral 19 is triggered at the negative going transition of the output v3 of the second comparator 18, to produce a low level signal with the duration T. An AND gate 20 receives the output v3 of the second voltage comparator 18 and the output v4 of the monostable multivibrator 19 to produce a signal v5 which in turn is coupled to the switch circuit 15.

Figure 4:
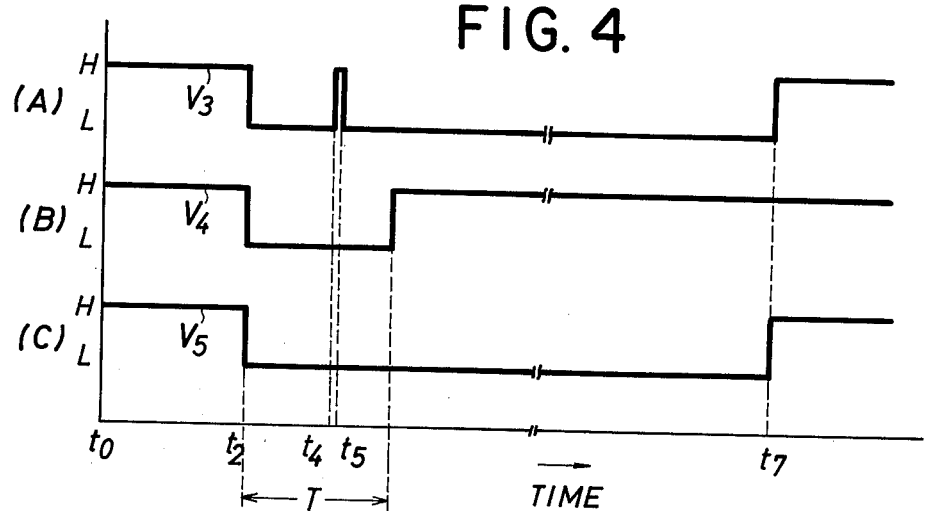
FIG. 4 is a set of waveforms useful in explaining the operation of the muting arrangement of FIG. 3.
Figure 5:
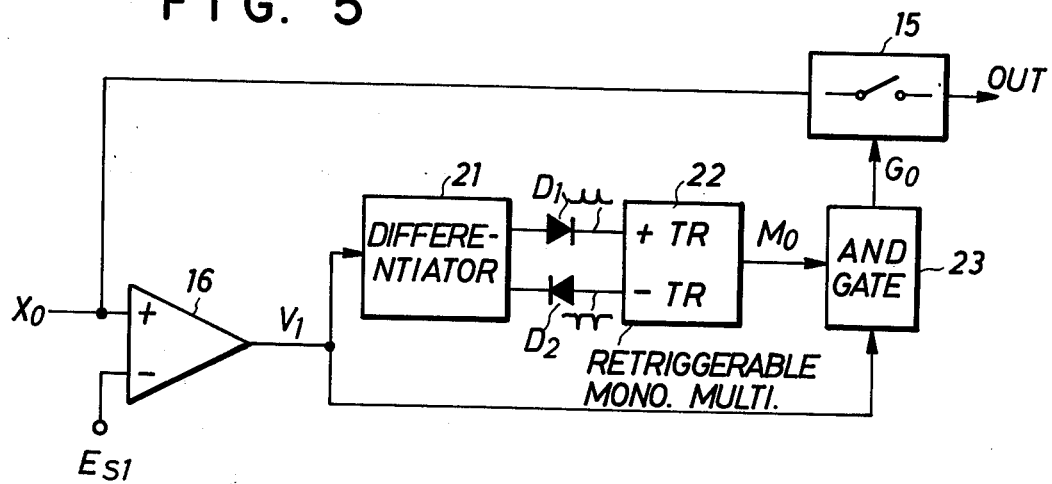
FIG. 5 is a block diagram of a further embodiment of the muting arrangement according to the present invention.

As shown in FIG. 4A, even if the output v3 of the voltage comparator 18 becomes high during the time period $t_4$ to $t_5$, the AND gate 20 does not produce the high level output during the said period since the output v4 of the monostable multivibrator 19 sustains the low level during a properly selected period T (longer than the period $t_2$ to $t_5$) starting at time $t_2$ of the negative going transition of the output voltage v3, as shown in FIG. 4B. As seen from FIG. 4, in FIG. 3 embodiment, the detector output is never unmuted during the period of time $t_2$ to $t_7$, unlike the FIG. 1 embodiment. Note that the sawtooth wave generator 17 and the second voltage comparator 18 in FIG. 3 may be omitted if a retriggerable monostable nultivibrator is used for the monostable multivibrator, as shown in FIG. 5. As shown, upon receipt of the output v1 of the first voltage comparator 16, a differentiator 21 produces differentiated outputs at the respective negative and positive transitions of the output v1. The positive and negative pulses, i.e., the differentiated outputs, of the differentiator circuit 21 are fed to trigger terminals +TR and −TR of the retriggerable monostable multivibrator 22, through respective diodes D1 and D2. The output Mo of the multivibrator 22 and the output v1 of the voltage comparator 16 are coupled with the inputs of an AND gate 23 whose output is connected to the switch circuit 15.

Figure 6:
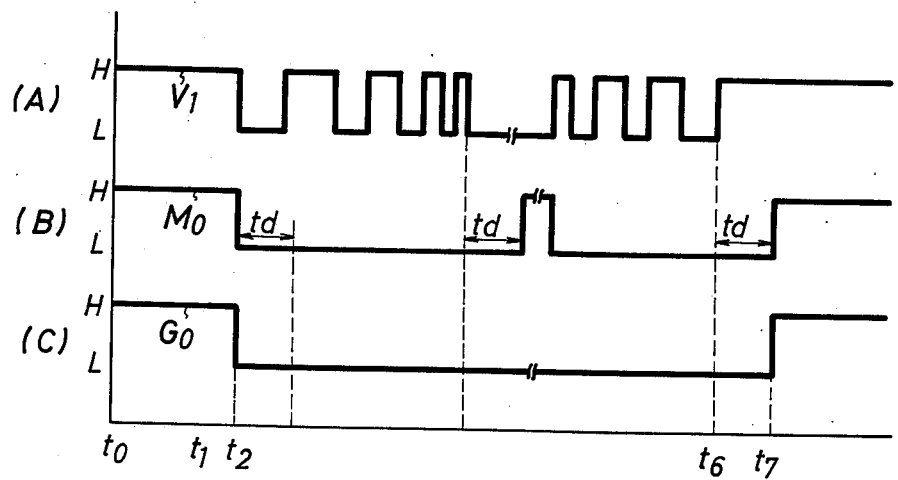
FIG. 6 is a set of timing diagrams for illustrating the operation of the muting arrangement of FIG. 5.

In operation, the retriggerable multivibrator 22 changes its output Mo from high to low level when it is triggered by the positive or negative pulse, as shown in FIG. 6B. When subsequent input pulse does not income within the delay time $td$ defined by the time constant circuit, the multivibrator changes its output from low to high level after $td$ from the initial trigger. If the succeeding positive or negative pulse retriggers the multivibrator 22 within $td$, it keeps its output low at least within $td$ from the retrigger. Accordingly, the multivibrator 22 possibly produces a high level signal during a relatively long period that the output v1 of the voltage comparator 16 is low, while during the period the AND gate 23 keeps its output low in level. As seen from FIG. 6, the detector output is muted during the period $t_2$ to $t_7$, also in the FIG. 5 embodiment. An integrated circuit CD4098BE manufactured by RCA Company, for example, may be used for the retriggerable monostable multivibrator.

What we claim is:

1. A muting system wherein an amplitude modulated signal is connected as input to a phase locked loop circuit, the output of the phase locked loop circuit and the amplitude modulated signal are supplied as inputs to an AM synchronous detector, the improvement comprising:
   muting means coupled with the output of said synchronous detector for muting the output from said detector;
   first voltage comparing means for comparing the detector output level with a first reference potential level; and
   control means coupled between the output of said first voltage comparing means and said muting means for causing said muting means to immediately mute the detector output when the detector output level falls below the first reference potential level and to stop the muting of the detector output after a predetermined retardation when the detector output level exceeds the first reference potential level.

2. A muting arrangement according to claim 1, in which said control means includes a monostable multivibrator coupled to the output of said first voltage comparing means, and a logic gate connected with the output of said first voltage comparing means and the output of said monostable multivibrator.

3. A muting arrangement according to claim 2, in which said monostable multivibrator is a retriggerable monostable multivibrator.

4. A muting arrangement according to claim 1, in which said control means includes sawtooth wave generating means connected with the output of said first voltage comparing means for producing a sawtooth wave signal when the detector output level exceeds the first reference potential level, and second voltage comparing means coupled with said muting means for comparing the output of said sawtooth wave generating means with a second reference potential level.

5. A muting arrangement according to claim 4, in which said sawtooth wave generating means includes a series combination of a capacitor and a resistor, and a unidirectional device connecting the output of said first voltage comparing means with the junction between said capacitor and said resistor.

6. A muting arrangement according to claim 1, in which said control means includes sawtooth wave generating means connected with the output of said first comparing means for producing a sawtooth wave signal when the detector output level exceeds the first reference potential level, second voltage comparing means for comparing the output of said sawtooth wave generating means with a second reference potential level, a monostable multivibrator connected with the output of said second voltage comparing means, and a logic gate connected at the output to said muting means and at the input to the output of said second voltage comparing means and the output of said monostable multivibrator.

7. A muting arrangement according to claim 6, in which said sawtooth wave generating means includes a series combination of a capacitor and a resistor, and a unidirectional device connecting the output of said first voltage comparing means with the junction between said capacitor and said resistor.

* * * * *